United States Patent [19]

Maeda

[11] Patent Number: 5,581,125

[45] Date of Patent: Dec. 3, 1996

[54] INTERCONNECT FOR SEMICONDUCTOR DEVICES AND METHOD FOR FABRICATING SAME

[75] Inventor: Keiichi Maeda, Kanagawa, Japan

[73] Assignee: Sony Corporation, Tokyo, Japan

[21] Appl. No.: 468,710

[22] Filed: Jun. 6, 1995

Related U.S. Application Data

[62] Division of Ser. No. 206,652, Mar. 7, 1994, Pat. No. 5,449,641.

[30] Foreign Application Priority Data

Mar. 11, 1993 [JP] Japan .................................. 5-078894

[51] Int. Cl.[6] ........................... H01L 23/48; H01L 23/52; H01L 29/40
[52] U.S. Cl. ........................... 257/767; 257/627; 257/763; 257/770
[58] Field of Search .................................. 437/190, 195; 257/767, 763, 764, 770, 627, 628

[56] References Cited

U.S. PATENT DOCUMENTS

| | | | |
|---|---|---|---|
| 4,217,153 | 8/1980 | Fukunaga et al. | 148/182 |
| 5,242,860 | 9/1993 | Nulman et al. | 437/190 |
| 5,312,772 | 5/1994 | Yokoyama et al. | 437/190 |
| 5,449,641 | 9/1995 | Maeda | 437/195 |

*Primary Examiner*—Sara W. Crane
*Assistant Examiner*—David Ostrowski
*Attorney, Agent, or Firm*—Hill, Steadman & Simpson

[57] ABSTRACT

A method for forming an interconnect film (of aluminum or aluminum alloy) by high-temperature sputtering such that the resulting film has a flat surface. The flat surface is desirable for the multilayer interconnect structure, relieves the resist film from halation at the time of exposure, and makes the interconnect immune to electromigration.

An interconnect for semiconductor devices which is fabricated from an underlying film, with crystals therein orienting in the direction perpendicular to the substrate surface, and an interconnect film formed on the underlying film, with crystals therein orienting in alignment with the orientation of crystals in the underlying film and in the direction perpendicular to the substrate surface. The underlying film may be a titanium film with its (002), (001), or (011) crystal plane orienting in the direction perpendicular to the substrate surface. The interconnect film may be an aluminum film or aluminum alloy film with its (111) crystal plane orienting in alignment with the orientation of crystals in the titanium film and in the direction perpendicular to the substrate surface.

6 Claims, 3 Drawing Sheets

(related art)

INTERCONNECT FOR SEMICONDUCTOR DEVICES AND METHOD FOR FABRICATING SAME

The is a division of application Ser. No. 08/206,652, filed Mar. 7, 1994 now U.S. Pat. No. 5,449,641.

BACKGROUND OF THE INVENTION

1. Field of the Invention

The present invention relates to an interconnect for semiconductor devices.

2. Description of the Related Art

The trend to achieve higher packaging density and smaller chip size with increased circuit complexity requires the use of minute holes to connect circuit elements. This has necessitated the development of a new technology for embedding a material in the minute hole for interconnection. One way of achieving this object is by high-temperature sputtering of aluminum or aluminum alloy (both collectively referred to as aluminum hereinafter). This sputtering is designed to form an aluminum film while heating the semiconductor substrate at a temperature close to the melting point of aluminum, thereby keeping aluminum fluid. The molten aluminum flows into the hole for interconnection, forming a film with a smooth surface. This method offers the advantage of forming the interconnect film and embedded plug simultaneously and making use of the fact that aluminum has a low resistance. (According to the conventional method, the interconnect is formed after the tungsten plug has been formed by the selective growth of tungsten.)

Unfortunately, the above-mentioned high-temperature sputtering is not necessarily satisfactory, because it gives rise to an underlying film (2) which does not orient exactly perpendicular to the surface (1a) of the substrate (1), as shown in FIG. 1. (The direction of orientation is indicated by arrows.) Since the underlying film (2) affects the growth of the aluminum film (3) to be formed thereon, the direction of orientation of the aluminum film (3) is not perpendicular to the surface (1a) of the substrate (1). This leads to the undesirable surface morphology of the aluminum film (3). In other words, the aluminum film (3) has an irregular surface. (Hatching to signify a section is omitted from FIG. 1 for legibility.) When the aluminum film on the substrate (11) is used as an interconnect (12), the irregular surface remains on the interconnect (12), as shown in FIG. 2. This irregular surface reproduces another irregular surface on a first interlayer insulating film (13) covering the interconnect (12). The second irregular surface presents difficulties in forming on the film (13) a second layer for the interconnect (14). A second interlayer insulating film (15) covering the interconnect (14) has a more irregular surface than the first one (13). The larger the number of layers placed on top of another, the more it is difficult to form the interconnect.

The irregular surface also poses a problem in the photolithography process as illustrated in FIG. 3. There are shown a substrate (21), an aluminum film (22) having an irregular surface, and a photoresist film (23). The exposing radiation (31) penetrating the photoresist film (23) is irregularly reflected by the irregular surface of the aluminum film (22). The irregular reflection brings about halation in the crosshatched regions. After development, halation gives rise to a greatly thinned resist pattern (not shown). (Hatching to signify the section of the photoresist film (23) is omitted from FIG. 3.)

The irregular surface poses another problem, as shown in FIG. 4. An aluminum film formed on a metal (41) has an irregular surface and hence the interconnect (42) fabricated from it fluctuates in thickness. Thus, current flowing through the interconnect (42) fluctuates, generating heat at a thin part (42a) where the current density is high. The increased current density accelerates the electromigration and eventually breaks the interconnect.

OBJECT AND SUMMARY OF THE INVENTION

It is an object of the present invention to provide an interconnect for semiconductor devices which has good surface morphology.

The present invention is embodied in an interconnect for semiconductor devices which is fabricated from an interconnect film formed on a substrate, with crystals in the interconnect film orienting in the direction perpendicular to the substrate surface.

The present invention is also embodied in an interconnect for semiconductor devices as defined above, wherein the interconnect film is formed on the substrate, with an underlying film interposed between them, with crystals in said underlying film orienting in the direction perpendicular to the substrate surface, with crystals in the interconnect film orienting in alignment with the orientation of crystals in the underlying film and in the direction perpendicular to the substrate surface.

The present invention is also embodied in an interconnect for semiconductor devices as defined above, wherein the interconnect film is an aluminum film or an aluminum alloy film, with the (111) crystal plane therein orienting in the direction perpendicular to the substrate surface, and the underlying film is a titanium film, with the (002), (010), or (011) crystal plane therein orienting in the direction perpendicular to the substrate surface.

According to the present invention, the interconnect for semiconductor devices is fabricated from a film formed on an underlying film, with crystals in said underlying film orienting in the direction perpendicular to the substrate surface and crystals in said aluminum film or said aluminum alloy film orienting in the direction perpendicular to the substrate surface and in alignment with the orientation of crystals in the underlying film. Therefore, the film for the interconnect has a flat surface with good surface morphology.

DETAILED DESCRIPTION OF THE PREFERRED EMBODIMENTS

The invention will be described in more detail with reference to the following examples.

EXAMPLE 1

Figure 1:
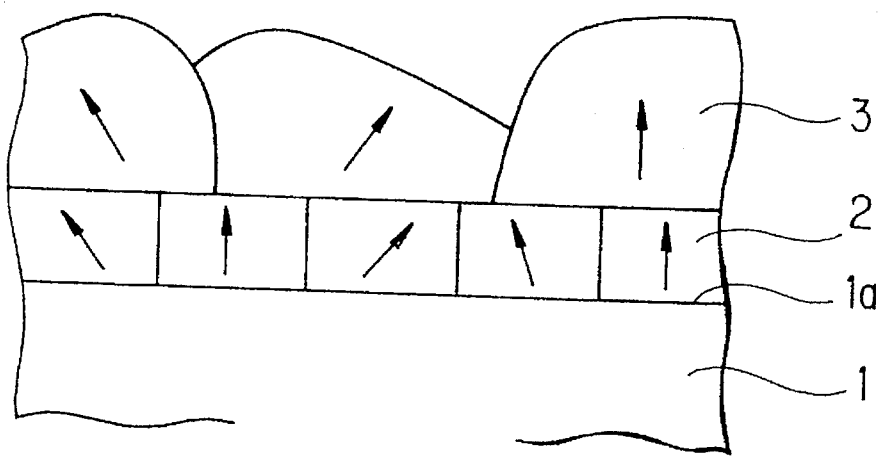
FIG. 1 is a schematic representation of the related art involving a problem associated with interconnects.
Figure 2:
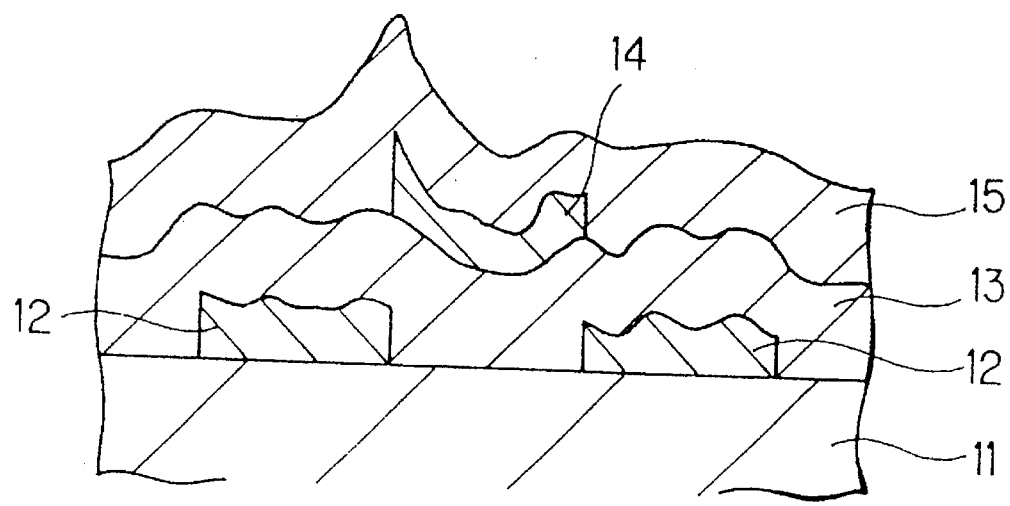
FIG. 2 is a schematic representation of the related art involving a problem associated with multilayer interconnects.
Figure 3:
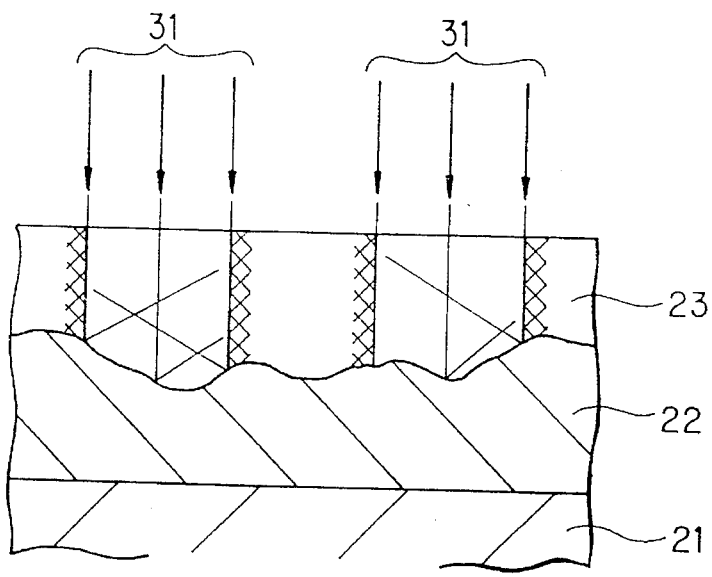
FIG. 3 is a schematic representation of the related art involving a problem associated with exposure.
Figure 4:
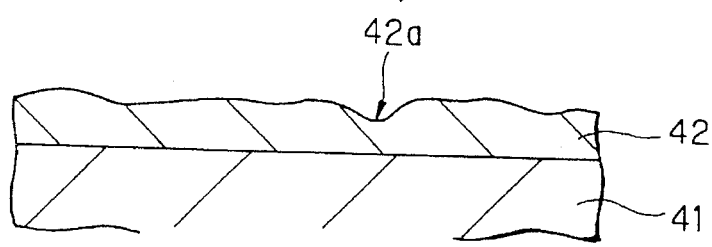
FIG. 4 is a schematic representation of the related art involving a problem associated with electromigration.
Figure 5:
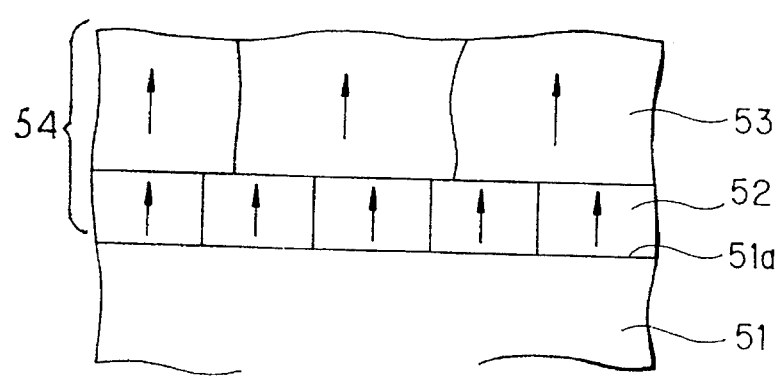
FIG. 5 is a schematic sectional view of the multi-layer interconnect in the first example of the present invention.

Refer to FIG. 5, which is a schematic sectional view. (Hatching to signify a cross section is omitted for legibility) There is shown a substrate (51). On the substrate (51) is formed an underlying film (52), the crystals of which are oriented in the direction of arrows which is perpendicular to the substrate surface (51a). On the underlying surface (52) is formed an interconnect film (53), the crystals of which are oriented in alignment with the orientation of crystals in the underlying film (52) and in the direction of arrows which is perpendicular to the substrate surface (51a). The interconnect (54) is fabricated from the underlying film (52) and the interconnect film (53).

The underlying film (52) may be a titanium film the (002), (010), or (011) crystal plane of which orients in the direction perpendicular to the substrate surface (51a). The interconnect film (53) may be an aluminum film the (111) crystal plane of which orients in alignment with the orientation of crystals in the titanium film and in the direction perpendicular to the substrate surface (51a).

Since the underlying film (52) and interconnect film (53) have their crystals oriented in the direction perpendicular to the substrate surface (51a), the interconnect film (53) has a flat surface with good morphology. This offers the following advantages.

In the multilayer interconnect structure, the interlayer insulating films formed on each interconnect have a flat surface because they are favorably affected by the flat interconnect surface. (The multilayer interconnect structure is produced by covering the interconnect (54) fabricated from the interconnect film (53) with a first interlayer insulating film (not shown), fabricating thereon the same interconnect (not shown) as above, and covering it with a second interlayer insulating film.)

The smooth surface of the interconnect film (53) does not cause halation at the time of exposure in the resist film (not shown) formed on the interconnect film (53). The absence of halation leads to accurate resist patterning.

The interconnect film (53) has a uniform thickness owing to its smooth surface. The interconnect (54) fabricated from it is highly immune to electromigration.

EXAMPLE 2

FIGS. 6A to 6D illustrate a preferred embodiment of a smooth surface interconnect structure formed in a connecting hole of a substrate and a preferred method for making it.

Figure 6A:
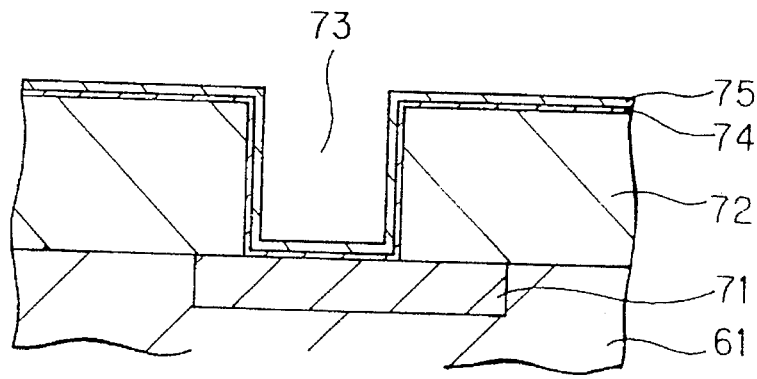
FIGS. 6A, 6B, 6C and 6D is a schematic representation of the method for fabricating the multilayer interconnect in the second example of the present invention.

As shown in FIG. 6A, a silicon substrate (61) is provided having a diffusion layer (71) defined on its upper surface. An insulating film (71) is formed on the upper surface of the substrate (61). A connecting hole (73) is formed in the insulating film (72) above the diffusion layer (71).

In accordance with the method of this invention, the interconnect structure is preferably formed in a continuous process under vacuum conditions. More particularly, to insure good adhesion to substrate (61), a first adhesion film of titanium (74) is applied onto the surfaces of the insulating film (72) including the side and bottom surfaces of connecting hole (73). The adhesion film (74) may be applied by sputtering the titanium onto the substrate using an argon process gas supplied at a flow rate of 100 sccm at 0.4 Pa, with 4 kW DC power, while heating the substrate to 150° C.

An anti-reaction film or barrier film (75) of titanium nitride or preferably titanium oxynitride is then formed on the adhesion film (74). Barrier film (75) is applied by sputtering the barrier material onto the adhesion layer (74) using a mixed process gas of argon and nitrogen supplied at a flow rate of 100 sccm and 70 sccm, respectively, at 0.4 Pa, with 5 kW DC power, while heating the substrate at 150° C. Thereafter, the 111 crystal plane of the barrier layer (75) metal is oriented perpendicular to the substrate (61) by subjecting the barrier metal to high temperature conditions above about 500° C. by furnace annealing or by RTA methods under vacuum.

Figure 6B:
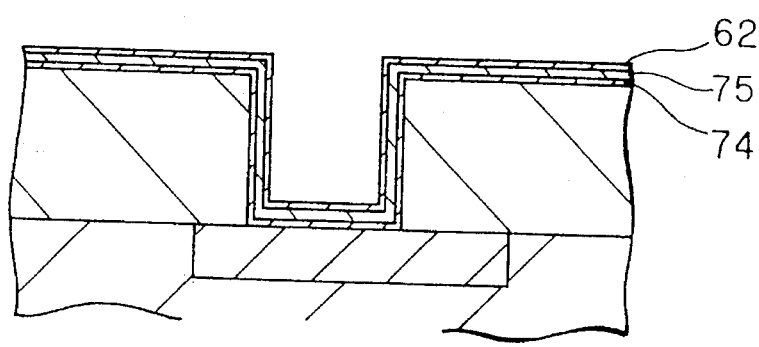

An underlying film (62) is formed on oriented barrier layer (75) as is shown in FIG. 6B by vacuum sputtering methods using an argon process gas supplied at a flow rate of 100 sccm at 0.4 Pa, with 4 kW DC power, while heating the substrate to 150° C. The underlying film (62) thus formed has its 002 crystal plane oriented in the direction perpendicular to the surface of barrier layer (75) on which it is formed. Annealing at higher temperatures by furnace annealing or RTA may cause the 010 plane or 011 plane of the underlying layer (62) to also orient perpendicularly with respect to barrier layer (75) and substrate (61).

Thereafter, an interconnect film (63) of aluminum-silicon or aluminum-silicon-copper is applied on the underlying layer (62) in a high temperature vacuum sputtering process. More particularly, an aluminum-1% silicon interconnect film may be applied using an argon process gas at a flow rate of 100 sccm at 0.4 Pa with 20 kW DC power while heating the substrate at high temperatures under vacuum at 500° C. Under these conditions, the interconnect film (63) of aluminum has its 111 crystal plane oriented in a direction perpendicular to the surface of underlying film (62).

Figure 6C:
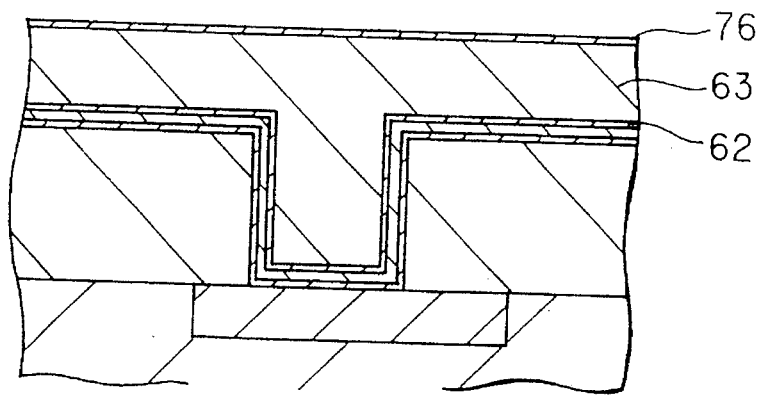

Thereafter, as shown in FIG. 6C, an anti-reflection film (76) of titanium oxynitride (TiON) is applied onto the interconnect layer (63). Anti-reflection film (76) is applied by sputtering in a mixed process gas of argon and nitrogen containing 6% oxygen supplied at a flow rate of 100 sccm and 70 sccm, respectively, at 0.4 Pa, with 5 kW DC power, while heating the substrate at 150° C.

Figure 6D:
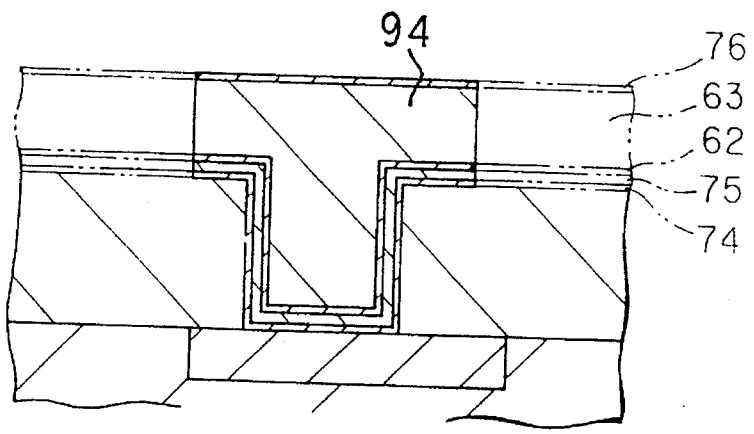

Photolithography and ensuing dry etching are carried out to remove the anti-reflection film (76), interconnect film (63), underlying film (62), anti-reaction film (75), and adhesion film (74) (indicated by two-dot chain lines in FIG. 6D). In this way the interconnect (94) is formed.

Although the above-mentioned process is based on sputtering, it is possible to fabricate the interconnect by any other methods such as CVD. The above-mentioned sputtering conditions may be modified according to the apparatus employed and the direction of orientation.

These examples demonstrate that the present invention offers the advantage that the interconnect has a flat surface with good morphology because it is fabricated from an underlying film (whose crystal plane is oriented in the direction perpendicular to the substrate surface) and an interconnect film (whose crystal plane is oriented in alignment with the orientation of crystals in the underlying film and in the direction perpendicular to the substrate surface). If the case of multilayer interconnect formed in this way, the interlayer insulating films have a flat surface. The flat surface of the interconnect film does not cause halation at the time of exposure in the photolithography process. The absence of halation leads to an accurate pattering (or interconnect). Since the interconnect film with a flat surface has a uniform thickness, the resulting interconnect is highly immune to electromigration.

What is claimed is:

1. An interconnect for semiconductor comprising:
   a substrate;

an adhesion layer of titanium disposed on the surface of the substrate;

a barrier layer of TiON disposed on the surface of the adhesion layer, a (111) crystal plane of the barrier layer being oriented perpendicular to the surface of the substrate;

an underlying layer of titanium disposed on the barrier layer, a crystal plane of said underlying layer being selected from the group of (002), (010) and (011) crystal planes being oriented in a direction perpendicular to the barrier layer on which the underlying layer is disposed;

an interconnect film of aluminum or an aluminum alloy disposed on said underlying film, a (111) crystal plane of the interconnected film being oriented perpendicular to the underlying layer; and an anti-reflect ion film of TiON disposed on said interconnect film.

2. An interconnected for semiconductor device comprising:

substrate;

an underlying film disposed on the surface of the substrate, a crystal plane of said underlying layer selected from the group of (002), (010) and (011) crystal planes being oriented in a direction perpendicular to the surface of the substrate; and an interconnect film disposed on the surface of the underlying film, a crystal plane of the interconnected film being oriented perpendicular to the substrate surface.

3. An interconnect for semiconductor devices as defined in claim 2, wherein the interconnect film is an aluminum film or an aluminum alloy film, with the (111) crystal plane therein orienting in the direction perpendicular to the substrate surface.

4. The interconnect to claim 2, wherein the underlying film is a titanium film.

5. An interconnect for semiconductor devices as defined in claim 4, wherein the titanium underlying film is given improved crystal orientation by increasing its thickness.

6. An interconnect for semiconductor devices as defined in claim 4, wherein the titanium underlying film is given improved crystal orientation by forming it by bias sputtering.

\* \* \* \* \*